United States Patent
Attalla et al.

(10) Patent No.: US 7,274,201 B2
(45) Date of Patent: Sep. 25, 2007

(54) METHOD AND SYSTEM FOR STRESSING SEMICONDUCTOR WAFERS DURING BURN-IN

(75) Inventors: Hani S. Attalla, Boise, ID (US); Mark Bunn, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 24 days.

(21) Appl. No.: 11/133,843

(22) Filed: May 19, 2005

(65) Prior Publication Data

US 2006/0261836 A1    Nov. 23, 2006

(51) Int. Cl.
    *G01R 31/26*    (2006.01)
(52) U.S. Cl. .................. 324/765; 324/760; 324/763
(58) Field of Classification Search ............... None
    See application file for complete search history.

(56) References Cited

U.S. PATENT DOCUMENTS

| | | | |
|---|---|---|---|
| 3,795,972 A | 3/1974 | Calhoun | |
| 3,835,530 A | 9/1974 | Kilby | |
| 3,839,781 A | 10/1974 | Russell | |
| 3,849,872 A | 11/1974 | Hubacher | |
| 4,104,785 A | 8/1978 | Shiba et al. | |
| 4,288,911 A | 9/1981 | Ports | |
| 4,778,771 A | 10/1988 | Hiki | |
| 4,866,714 A | 9/1989 | Adams et al. | |
| 4,967,146 A | 10/1990 | Morgan et al. | |
| 5,047,711 A | 9/1991 | Smith et al. | |
| 5,059,899 A | 10/1991 | Farnworth et al. | |
| 5,279,975 A | 1/1994 | Devereaux et al. | |
| 5,539,324 A | 7/1996 | Wood et al. | |
| 5,570,032 A | 10/1996 | Atkins et al. | |
| 5,848,017 A | 12/1998 | Bissey | |
| 5,959,913 A | 9/1999 | Raad | |
| 6,727,722 B2 | 4/2004 | Whetsel | |
| 6,894,526 B2 * | 5/2005 | Marr | 324/765 |

* cited by examiner

*Primary Examiner*—Minh N. Tang
(74) *Attorney, Agent, or Firm*—TraskBritt

(57) ABSTRACT

A method and system for testing a plurality of semiconductor dice on a semiconductor wafer during burn-in includes forming a plurality of semiconductor dice with each die including an integrated circuit and built-in self stress circuitry coupled thereto. The built-in self stress circuitry includes contacts coupled thereto that are configured for probing by a probe card on a burn-in tester. The built-in self stress circuitry, through an interface with the integrated circuit, generates signals for exercising the operation of the integrated circuit during burn-in testing. Each of the plurality of semiconductor dice on the semiconductor wafer are individually controllable by the burn-in tester.

29 Claims, 7 Drawing Sheets

METHOD AND SYSTEM FOR STRESSING SEMICONDUCTOR WAFERS DURING BURN-IN

BACKGROUND OF THE INVENTION

1. Field of the Invention

This invention relates generally to testing a semiconductor wafer. More particularly, the present invention relates to stressing semiconductor die configured in wafer form during burn-in testing.

2. State of the Art

Processed semiconductor wafers typically include an array of identical, substantially isolated circuitry, each of which is individually referred to as a "die" and also commonly referred to as a "chip." Each semiconductor die includes specific circuitry for performing an integrated function. One common type of integrated circuit includes memory circuits for storing and retrieving information.

While many chips may be formed on a semiconductor wafer, not all chips formed on a semiconductor wafer operate in an acceptable manner, resulting in a "yield" of operable chips of less than 100%. Accordingly, individual dice must be tested to identify acceptably functional ones from inferior or even inoperable ones. A conventional test procedure for identifying functional dice occurs following the fabrication of an entire wafer of dice having a protective or passivation layer thereon. The protective passivation layer is then selectively removed to reveal or expose bond pads on the individual die which correspond to inputs and outputs of the integrated circuit. Once the bond pads are exposed, the semiconductor wafer is subjected to test probing whereby the individual dice are tested for satisfactory operation.

Inoperable dice are identified and noted, whereupon the semiconductor wafer is segmented or "singulated" into individual dice and segregated according to the previous test results. The acceptable or functional individual dice are assembled into final packages with the packaged dice being loaded into burn-in boards which comprise printed circuit boards having individual sockets for receiving the packaged parts. The populated burn-in boards are then placed into burn-in ovens whereupon the packaged dice are subjected to burn-in testing. Thereafter, the packaged dice are retested for functionality and further resorted into acceptable functional packaged dice and unacceptable or inoperative packaged dice.

As noted, a conventional burn-in test occurs on packaged parts which are then placed into sockets on a burn-in board. Such segmenting of the individual dice from a wafer-level configuration followed by the associated packaging of such parts may result in an appreciable increase in volume and dimensions for the testing of each die. Such a testing constraint results in a diminished number of semiconductor dice that may be subjected to burn-in testing during a single burn-in test sequence. To overcome such a shortcoming, wafer-level burn-in testing would be desirable, wherein a probe card having contact pins corresponding to the exposed bond pads for each of the dice on a semiconductor wafer may be coupled. While such an arrangement could be theoretically designed, such an arrangement is prohibitive and impractical due to the ever-increasing reduction in dimensions associated with the integrated circuits located on an individual die and the complexity and abundance of bond pads. Furthermore, the practicalities of forming a reliable connection with each of thousands of microscopic bond pads quickly becomes a reliability concern as well as an economic issue.

As a further matter of practicality, one aspect of electronic packaging includes formation of a multi-chip package wherein a plurality of semiconductor dice are placed and conductively coupled in a single package. Burning-in individual die prior to placing them in higher assemblies is clearly desirable. By way of example, the yield of a functional multi-chip module or package is a product of the overall yields of each of the components. Therefore, the yield of a multi-chip module formed from unburned-in parts is dramatically reduced by the use of semiconductor dice that have not been previously stressed and screened prior to packaging.

Additionally, burning-in semiconductor dice at a wafer-level accommodates the use of higher burn-in temperatures that are outside the specifications of the packaging material of conventional packages. Also, cost reductions are further manifest through economic efficiencies associated with scrapping packages associated with inoperative semiconductor dice and the related packaging labor.

As another matter of practicality, many integrated circuit customers acquire individual unpackaged dice for integration into higher level assemblies without relying upon an interface as provided for by the packaging of an integrated circuit die. While individual package dice have conventionally been subjected to burn-in testing to identify and dispose of inferior ones, the reliable culling of burn-in stressed unpackaged dice has remained elusive. Notwithstanding, customers maintain an expectation of quality in unpackaged integrated circuit dice as they have come to expect in burn-in stressed packaged integrated circuit dice. Therefore, it would be desirable to provide a method and system for stressing unpackaged integrated circuit dice during burn-in testing in order to segregate acceptable functional integrated circuit dice from inferior ones.

BRIEF SUMMARY OF THE INVENTION

The present invention, in exemplary embodiments, relates to a system and method for stressing semiconductor wafers during burn-in testing. In one embodiment of the present invention, a semiconductor die configured for wafer-level burn-in is provided. The semiconductor die includes an integrated circuit including at least one interface and built-in self stress circuitry configured to exercise the at least one interface of the integrated circuit during the wafer-level burn-in of the semiconductor die. The semiconductor die further includes a plurality of contacts coupled to the built-in self stress circuitry and configured to individually operably enable the built-in self stress circuitry when the semiconductor die is integral in a semiconductor wafer.

In another embodiment of the present invention, a semiconductor wafer includes a plurality of semiconductor dice substantially isolated from each other. The semiconductor wafer further includes scribe lanes for providing electrical isolation to the plurality of semiconductor dice. Each of the plurality of semiconductor dice includes an integrated circuit including at least one interface and built-in self stress circuitry configured to exercise the at least one interface of the integrated circuit during wafer-level burn-in of the semiconductor wafer. The semiconductor dice each further include a plurality of contacts coupled to the built-in self stress circuitry and configured to individually operably enable the built-in self stress circuitry.

In yet another embodiment of the present invention, a method for testing a plurality of semiconductor dice is provided. A plurality of semiconductor dice is formed on a semiconductor wafer with each semiconductor die including an integrated circuit and built-in self stress circuitry. A plurality of contacts are formed on each of the plurality of semiconductor dice with each of the plurality of contacts coupled to the built-in self stress circuitry and configured to individually operably enable the built-in self stress circuitry during wafer-level burn-in.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Referring in general to the following description and accompanying drawings, various aspects of the present invention are illustrated to show its structure and method of operation. Common elements of the illustrated embodiments are designated with like numerals. It should be understood the figures presented are not meant to be illustrative of actual views of any particular portion of the actual structure or method, but are merely idealized representations which are employed to more clearly and fully depict the present invention.

Quality and reliability are factors of utmost concern in designing and selling integrated circuits. Customers have come to expect certain levels of quality in conventionally processed and packaged parts. However, when new forms of integration dictate modifications to packaging of integrated circuits (or no packaging at all as in the case of the merchandizing of individual integrated dice or intact semiconductor wafers), new methods for stressing and culling inferior integrated circuits must be devised. The various embodiments of the present invention provide a methodology and system for stressing semiconductor dice while in a semiconductor wafer arrangement. The various embodiments of the present invention occupy negligible amounts of "real estate" on the semiconductor die and enable a simulation of testing sequences that are consistent with customer-accepted methodologies.

Figure 1:
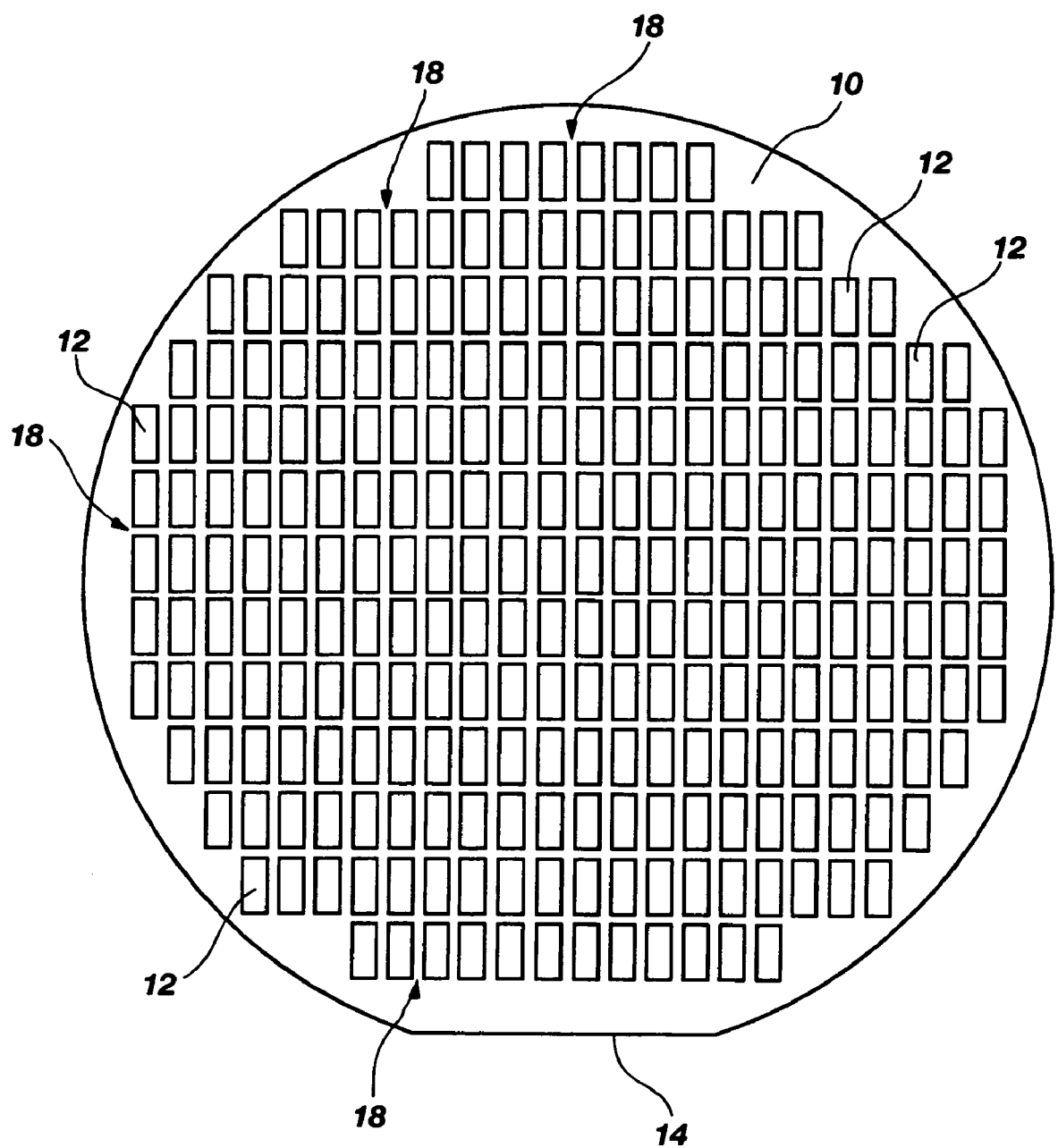
FIG. 1 is a top plan view of a semiconductor wafer processed in accordance with an embodiment of the present invention.

FIG. 1 illustrates a semiconductor wafer 10 comprised of an array of integrated circuit dice 12 independently formed and configured for singulation from the semiconductor wafer 10. For alignment purposes, semiconductor wafer 10 is formed with one or more flat edges 14 for defining a radial orientation of the semiconductor wafer 10 about an axis perpendicular to the major plane thereof. The semiconductor wafer 10 further includes one or more scribe lanes 18 defining unusable areas or "streets" through which the semiconductor wafer will be severed to produce singulated dice 12.

As further described below, each individual die 12 includes an integrated circuit for performing an intended function (e.g., memory circuit), and built-in self stress circuitry coupled thereto. While one embodiment of the present invention contemplates a one-to-one correspondence of built-in self stress circuitry to the integrated circuit on the individual die, other embodiments contemplate a distribution of one built-in self stress circuitry directly coupled or multiplexed with a plurality of integrated circuits on a corresponding plurality of dice 12. However, in a currently preferred embodiment, the built-in self stress circuitry is associated with an individual integrated circuit on a single die.

Figure 2:
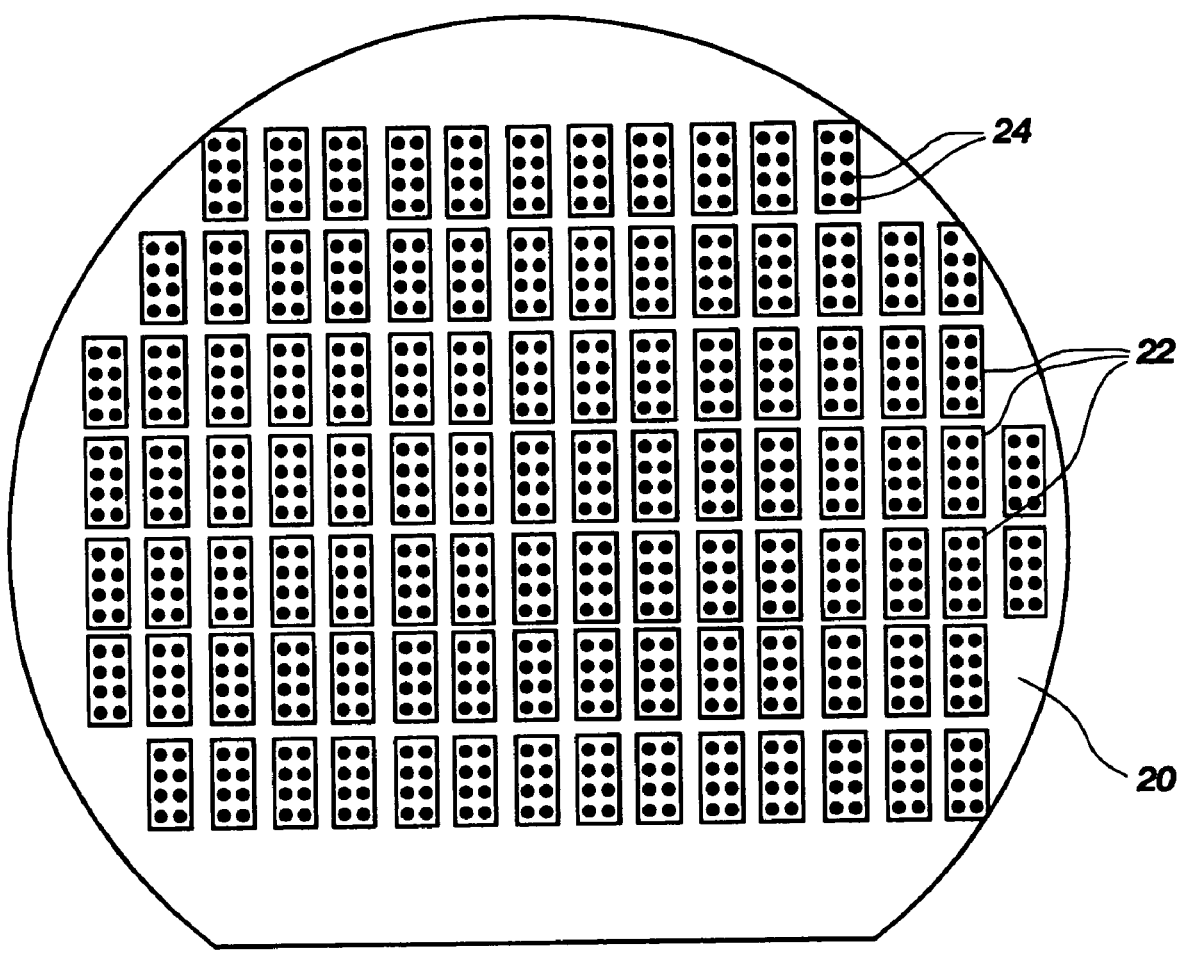
FIG. 2 is a top plan view of a semiconductor wafer including a redistribution layer, in accordance with an embodiment of the present invention.

FIG. 2 schematically illustrates a further processed semiconductor wafer configured for wafer-level burn-in testing, in accordance with an embodiment of the present invention. A semiconductor wafer 20 is illustrated as generally being comprised of a plurality of semiconductor dice 22, each of which is in the form of a processed die 22 having an integrated circuit formed thereon, in accordance with desired specific semiconductor device function. Each of the semiconductor dice 22 further includes built-in self stress circuitry operably coupled to the corresponding integrated circuit. The semiconductor wafer 20 is further processed to form burn-in accessible contacts for interacting during burn-in testing with the built-in self stress circuitry that is also coupled to the integrated circuit. The formation of the burn-in accessible contacts, in one embodiment, includes the fabrication of redistribution circuits on a wafer-level, as will be described with reference to FIGS. 2-4. A portion of the wafer-level redistribution circuit is illustrated in FIG. 2 according to the exposed portions, namely, contacts 24, a portion of which couples to the bond pads of the integrated circuit and another portion of which couples to bond pads of the built-in self stress circuitry. The built-in self stress contacts 24 are individually utilized for testing of individual dice during burn-in testing by selectively contacting them to provide power and enablement signals to the built-in self stress circuitry located on each individual die 22.

Figure 3:
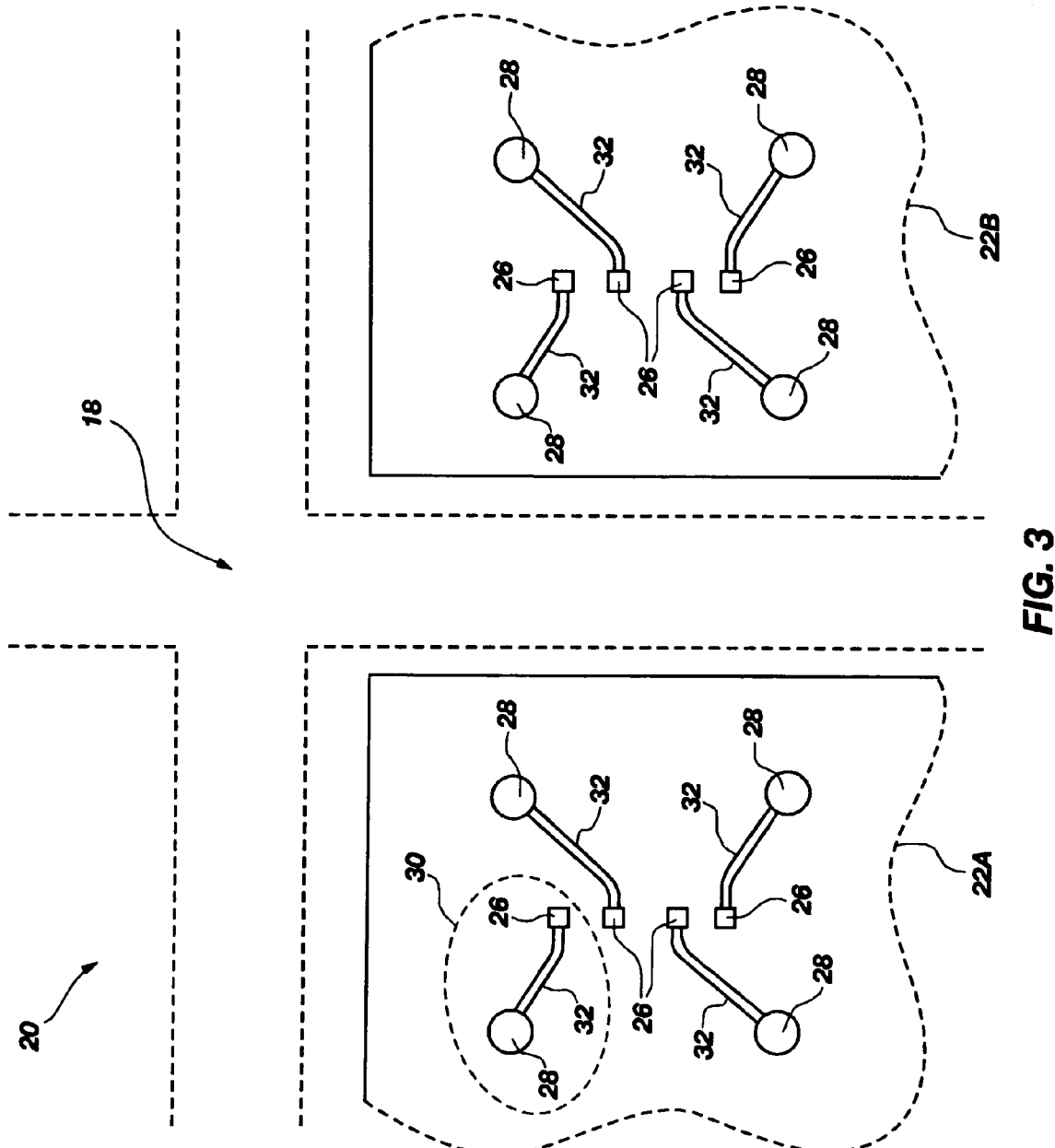
FIG. 3 is a detailed view of a portion of a semiconductor wafer having a redistribution layer thereon, in accordance with an embodiment of the present invention.

FIG. 3 is a detailed top view of a portion of a semiconductor wafer 20 illustrating the redistribution circuit, in accordance with an embodiment of the present invention. FIG. 3 illustrates adjacent semiconductor dice 22A, 22B as interconnected and configured with contacts for probing at a wafer-scale level. Dice 22A and 22B are separated by street or scribe lanes 18 for use in a post wafer-level burn-in segmentation process wherein die 22A and die 22B are segmented from the unitary semiconductor wafer 20 into physically separate dice.

Each of dice 22A and 22B comprises a series or plurality of bond pads 26. Bond pads 26 comprise enlarged electrical connections which extend to the microscopic integrated circuitry of the integrated circuit and the built-in self stress circuitry formed within each of the dice 22A, 22B. Such bond pads 26 are prohibitively small for providing a reliable and adequate area for probing by an external wafer-level probing or interface device. The bond pads 26 are therefore further routed using a redistribution layer for spatially distributing the interface to accommodate enlarged and more accessible contacts 28. As illustrated in FIG. 3, an exemplary redistribution circuit 30 for facilitating the coupling of bond pad 26 with contact 28 includes a patterned conductor 32 for facilitating electrical contact between contact 28 and bond pad 26. Manufacturing processes for such a redistribution circuit 30 are generally known. The use of a redistribution circuit for spatially separating the contacts is beneficial in allowing a more crude, larger tolerance alignment with the target contact, but also facilitates a more reliable interconnection with the contact due to variable misalignment due to expansion and contraction of the die over extreme temperature variations.

Figure 4:
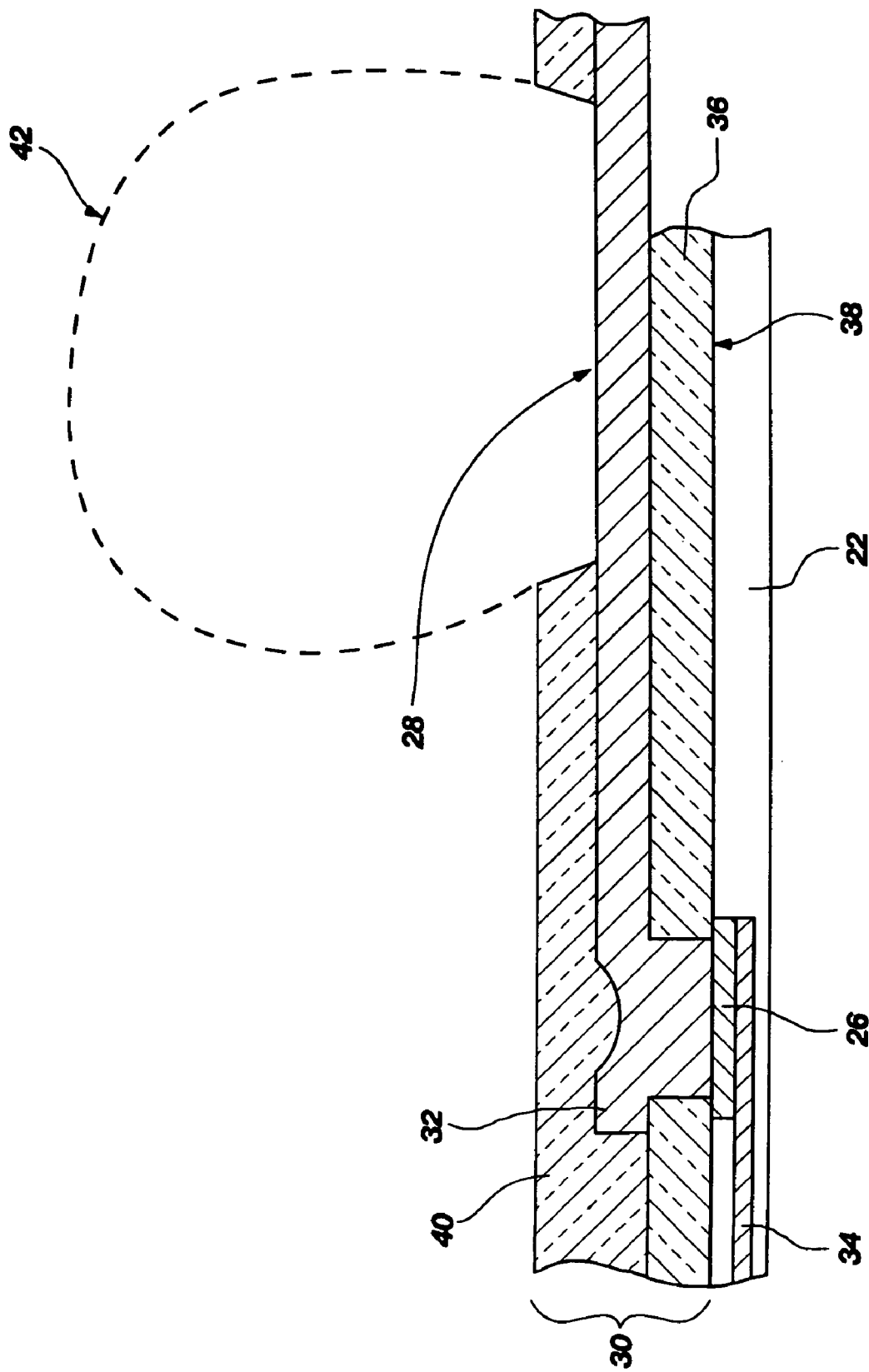
FIG. 4 is a cross-sectional view of a built-in self stress contact formed as a redistribution layer, in accordance with an embodiment of the present invention.

FIG. 4 is a cross-sectional view of a redistribution circuit 30, in accordance with an embodiment of the present invention. The formation of a redistribution circuit 30 may occur as a post process to the fabrication of the integrated circuits and built-in self stress circuitry on the plurality of dice 12 (FIG. 1) of semiconductor wafer 10. At such a post integrated circuit fabrication step, the formation of the redistribution circuit 30 results in a spatial spreading of the interfaces of each dice. With reference to FIG. 4, the die 22 of semiconductor wafer 20 includes a pattern of bond pads 26, each in electrical communication with a contact 28. In addition, the die 22 includes internal conductors or metallization 34 in electrical communication with the bond pads 26 and with various integrated circuits formed on the die 22.

The wafer-level redistribution circuit 30, formed on a surface 38 of the passivation layer 36, interconnects the contacts 28 to the bond pads 26. The redistribution circuit 30 includes a pattern of conductors 32 in electrical communication with the bond pads 26 and an outer passivation layer 40 which covers the conductors 32. The conductors 32 may include a "fan out" configuration to provide a spatially desirable pitch and pattern for the contacts 28. Redistribution circuit 30 may be manufactured using deposition, masking and etching steps for exposing bond pads 26 and depositing a pattern of conductors 32 in a desired interconnection array. Contact 28 may be further configured as an extended contact 42 such as a "solder bump." Alternatively, an extended contact may be added to contact 28 either before or after burn-in testing.

Additionally, the outer passivation layer 40 of the redistribution circuit 30 insulates the conductors 32 and may help to locate and confine any subsequently applied extended contacts 42, such as solder bumps. Thus, the outer passivation layer 40 may function as a solder mask to prevent solder from flowing between the contact 28 during attachment of the extended contact 42 during surface mounting of the semiconductor die 22. The outer passivation layer 40 may comprise a dielectric material. Suitable materials for the outer passivation layer 40 includes polymers, such as a polyimide, SiN, glasses, such as BSG, PSG, BPSG, or oxides, such as $SiO_2$.

Figure 5:
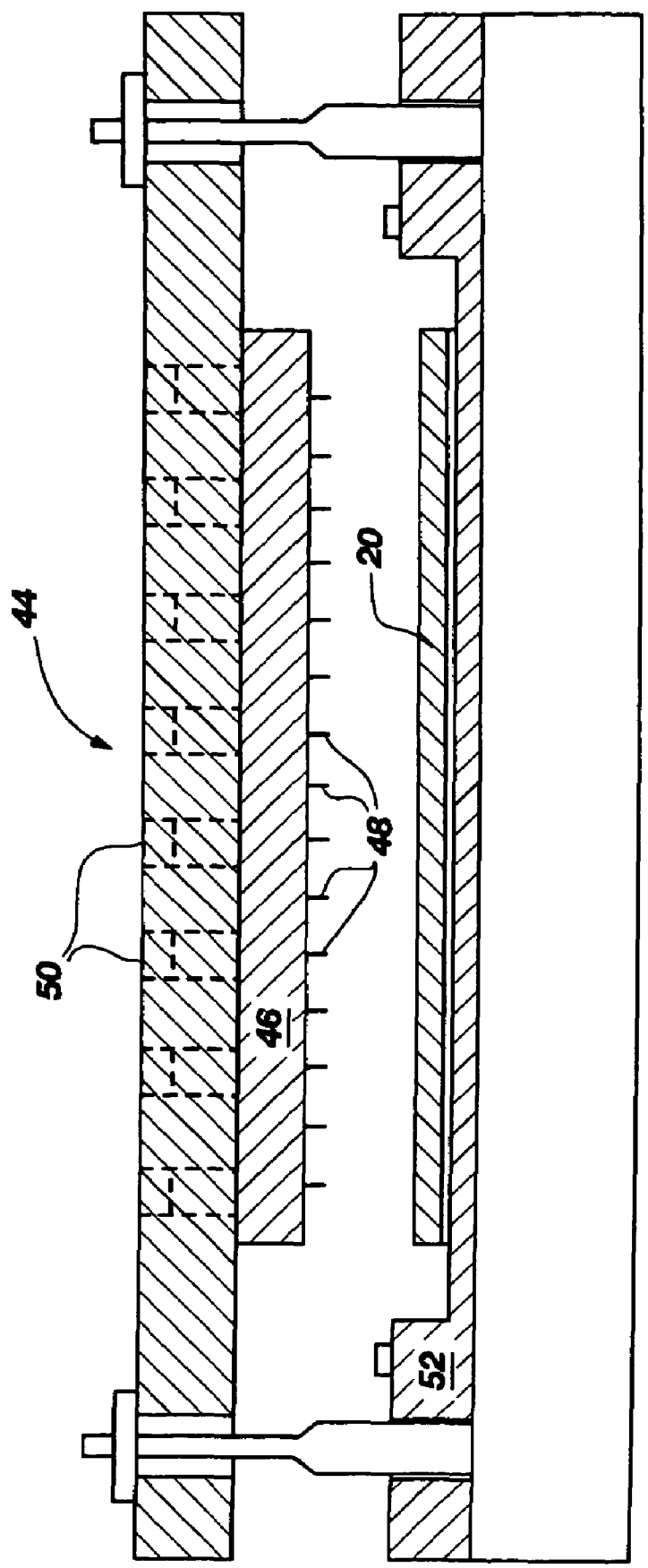
FIG. 5 is a side elevation view of a burn-in test fixture, in accordance with an embodiment of the present invention.

FIG. 5 illustrates a configuration and exemplary apparatus for operating the built-in self stress circuitry and the integrated circuit within each of the plurality of dice on a semiconductor wafer 20 during burn-in, in accordance with an embodiment of the present invention. In the present embodiment, the entire semiconductor wafer 20 is loaded into fixture 44, the cross-section of which is illustrated with reference to FIG. 5. In general, fixture 44 serves to bring a probe card 46 into precise alignment and electrical contact with the contacts 28 (FIG. 3) of the semiconductor wafer 20. Direct electrical contact is made between probe card 46 and semiconductor wafer 20 through a plurality of conductive probe pins 48 which correspond spatially with the portion of contacts 28 which are coupled to the built-in self stress circuitry of each die. Therefore, each die on a semiconductor wafer 20 may be independently powered, and may alternatively receive a status flag from the built-in self stress circuitry. The probe pins 48 are electrically coupled to tester conductors 50 which further electrically couple to connectors (not shown) and burn-in test equipment (not shown), according to interconnection techniques known by those of ordinary skill in the art. Additionally, semiconductor wafer 20 may be attached to a carrier frame 52 which may then be aligned and mated with probe card 46. Coupling and attachment of semiconductor wafer 20, probe card 46 and fixture 44 may be accomplished through mechanical alignment and retention or through other means such as vacuum attachment.

Figure 6:
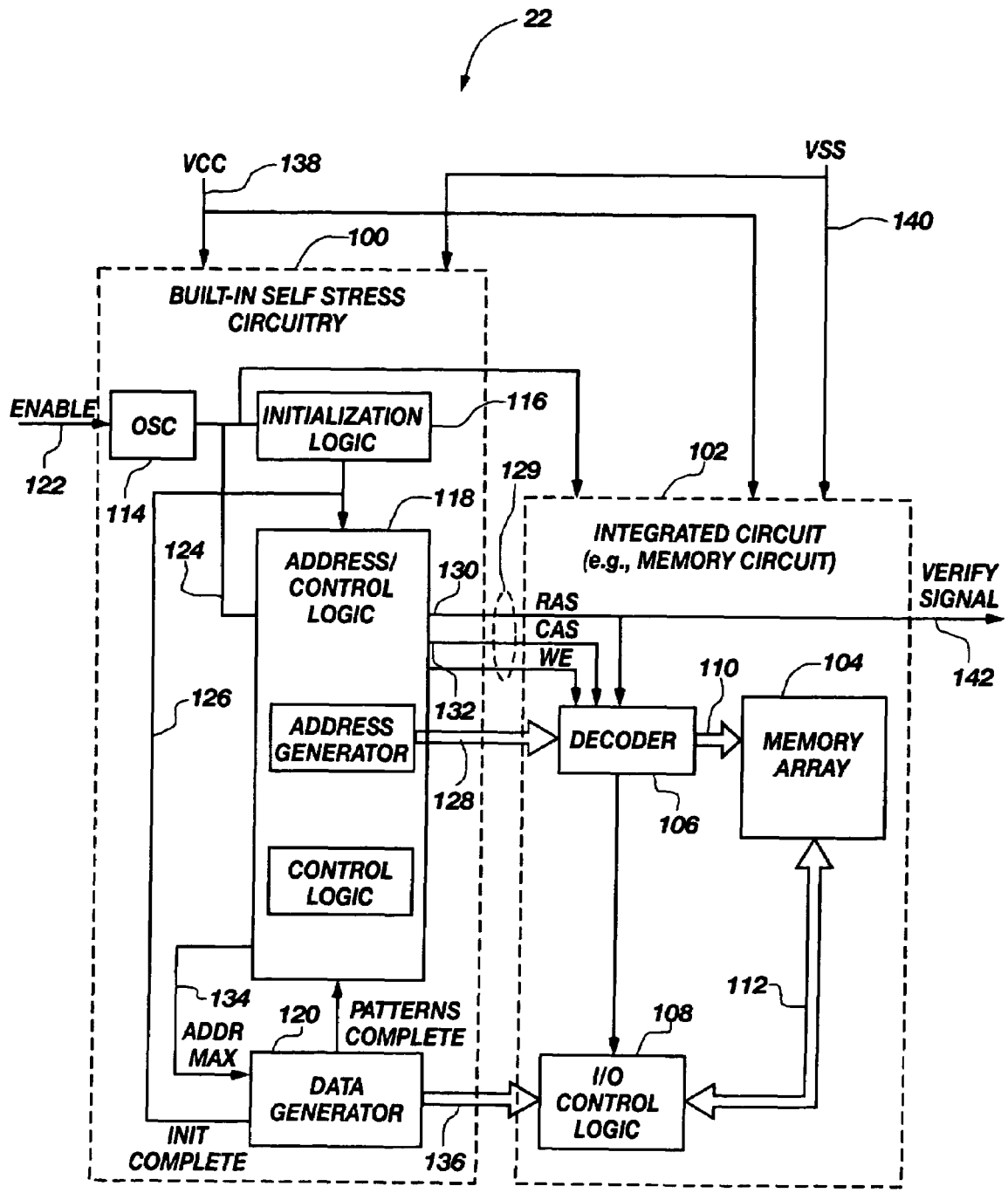
FIG. 6 is a schematic block diagram of a semiconductor die including built-in self stress circuitry, in accordance with an embodiment of the present invention.

FIG. 6 illustrates a die 22 including both built-in self stress circuitry 100 and an integrated circuit 102, in accordance with an exemplary embodiment of the present invention. Built-in self stress circuitry 100, in one embodiment, is provided on each of the individual dice 22 and interfaces with the integrated circuit 102 provided on each die 22. Integrated circuit 102 may comprise any of a number of electrical circuits including logic and analog type circuitry. A specific example of a particular integrated circuit is provided with reference to FIG. 6 in which the integrated circuit 102 is exemplarily illustrated as a computer memory integrated circuit 102 including a memory array 104, a decoder 106, and I/O control logic 108. Integrated circuit 102 represents the fundamental circuitry employed in conventional memory integrated circuits, such as SRAM or DRAM memory chips. Decoder 106 is coupled to memory array 104 through address bus 110. I/O control logic 108 is coupled to memory array 104 through a data bus 112.

Built-in self stress circuitry 100 utilizes a nominal number of interfaces per dice. Such a reduced number of interfaces greatly reduces the cost and complexity for generating a reliable method and system for coupling the semiconductor wafer to a burn-in tester during burn-in testing. In one embodiment of the present invention, the built-in self stress circuitry utilizes only four contacts per die: two power signals, VCC 138 and VSS 140, an enable signal 122 and a verify signal 142 to maintain a nominal individual interface with each die 22 on a semiconductor wafer.

Built-in self stress circuitry 100 includes an oscillator 114, initialization logic 116, address/control logic 118, and a data generator 120. These components of the built-in self stress circuitry 100 may all be activated during burn-in testing by a test enable signal 122. The oscillator 114 responds to the assertion of the test enable signal 122 and generates a clock signal 124 to initialization logic 116, address/control logic 118 and data generator 120. Oscillator 114 also provides clock signal 124 to integrated circuit 102.

Oscillator 114 is activated by the test enable signal 122 and generates a fixed frequency clock signal 124 that is used internally for the alignment and generation of address, data and control signals as well as provides a "system clock" signal to integrated circuit 102. Generally, the oscillator 114 performs two primary functions; namely, oscillator 114 generates a clock signal 124 for clocking integrated circuit 102 and generates a clock signal to the other logic elements of built-in self stress circuitry 100.

Once oscillator 114 is enabled by the test enable signal 122 and generates a steady state clock signal, the initialization logic 116 begins operation. Initialization logic 116 is configured to execute the initialization sequence as defined by specifications and data sheets associated with the specific integrated circuit 102. Initialization logic 116 executes the initialization sequence depicted by the specifications of the integrated circuit 102 prior to exercising, for example, a memory writing process associated with integrated circuit 102. When execution of the functionality of the initialization logic 116 completes, the initialization logic 116 asserts a complete signal 126 to both the data generator 120 and the address/control logic 118.

The address/control logic 118 is configured to generate control signals 129, which in the exemplary embodiment, are illustrated as row and column address signals 128. Taking into consideration the address topology and the timing differences in producing row versus column addresses, in one example, such row and column addresses are provided on common inputs to the integrated circuit 102 and utilize row and column address strobe signals 130, 132. Within the address/control logic 118, an address state machine (not shown) executes through the entire address space of the memory array 104. In one example, the address state machine executes through the addresses in the following order: bank fast, row fast, followed by column addresses. Once sequencing through all addresses has been completed, the address/control logic 118 asserts a complete signal 134 to the data generator 120 causing a change in the pattern generated by the data generator 120 and then the process of sequencing through the addresses as described above is repeated. In one example, a control state machine (not shown) within the address/control logic 118 cycles through various operations, namely, an active operation, a write operation, a precharge operation, and a NOP operation.

Data generator 120 is configured to generate one or more data patterns used during burn-in testing. In one example, eight patterns of data may be generated, namely a solid pattern, a solid bar pattern, a column stripes pattern, a column stripes bar pattern, a row stripes pattern, a row stripes bar pattern, a checkerboard pattern, and a checkerboard bar pattern. The data generator 120 continues generating the same pattern until it receives a signal 134 from the address/control logic 118 that all addresses have been written to using the current pattern. Upon receipt of the address complete signal 134 from the address/control logic 118, the data generator 120 advances or switches to generating the next defined pattern.

As a technique for monitoring activity on the die during operation, a verify signal 142 may be coupled to an internal signal that has an oscillating period that is conducive to monitoring rates of associated burn-in test equipment. While any periodic signal may be "tapped" for monitoring, in the exemplary embodiment of FIG. 6, the verify signal 142 is illustrated as being coupled to the periodic signal row address strobe signal 130.

Figure 7:
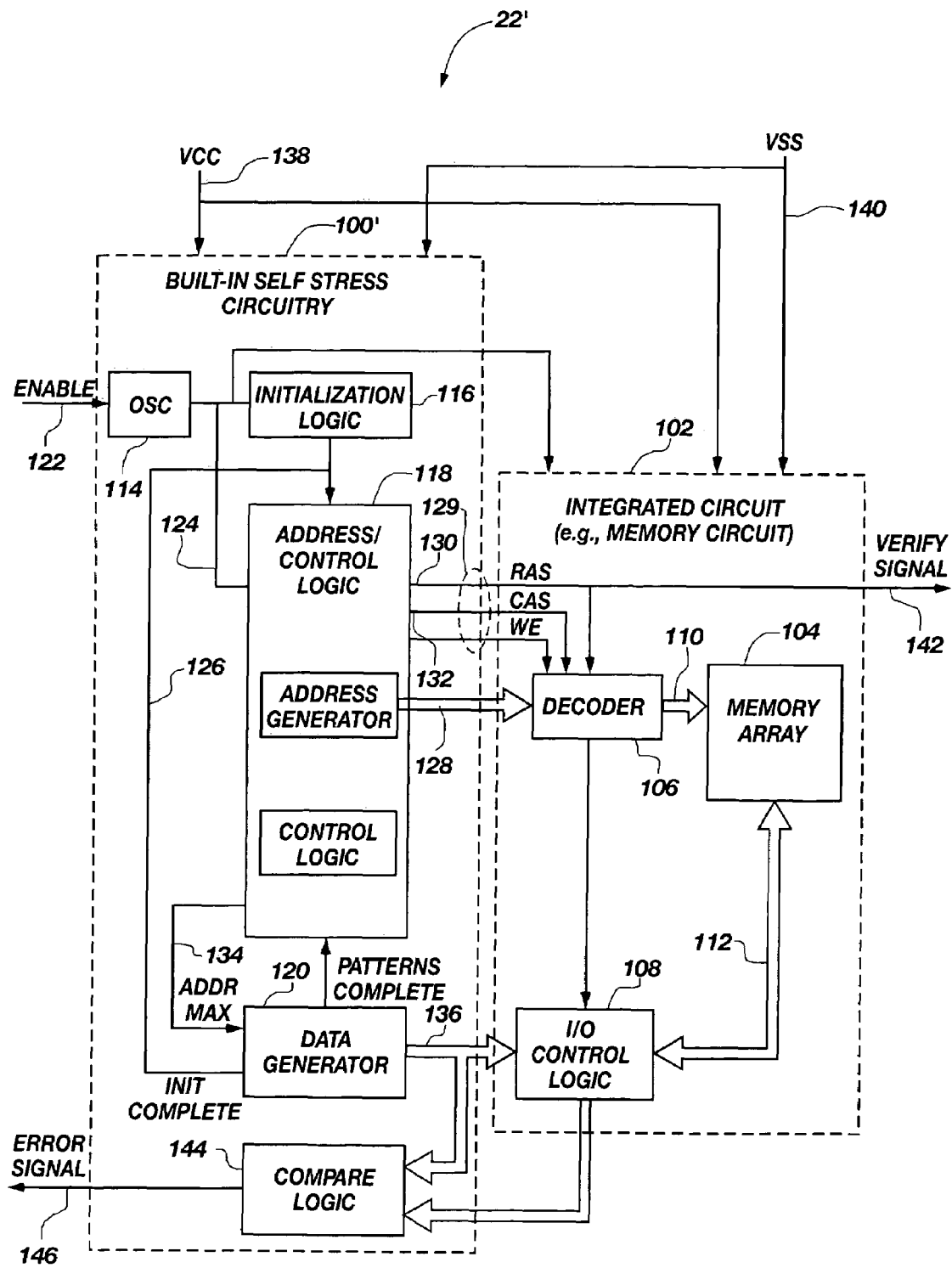
FIG. 7 is a schematic block diagram of a semiconductor die including built-in self stress circuitry, in accordance with another embodiment of the present invention.

FIG. 7 illustrates a die 22' including both built-in self stress circuitry 100' and an integrated circuit 102, in accordance with another embodiment of the present invention. In the present embodiment, built-in self stress circuitry 100' has the basic components described above with reference to the built-in self stress circuitry 100 (FIG. 6), but also is configured for detecting when the memory circuitry fails during burn-in testing. Such a comparative means identifies defective chips during the burn-in process and minimizes the need for probe testing of the individual die following the burn-in process.

Built-in self stress circuitry 100' comprises initialization logic 116, address/control logic 118, data generator 120 and compare logic 144 for generating an error signal 146. Initialization logic 116, address/control logic 118, data generator 120 are configured in the same manner discussed above with reference to built-in self stress circuitry 100 shown in FIG. 6. Compare logic 144 is coupled to receive test data generated by data generator 120 over data bus 136 and the actual data read from memory array 104 over bus 112. Compare logic 144 further receives control signals (not shown) from address/control logic 118 for clocking and resetting, the specifics of which are known by those of ordinary skill in the art. Compare logic 144 compares the test data written to memory array 104 with the actual data read from memory array 104. In this manner, if memory array 104 fails to properly store or inaccurately retrieves the test data, the actual data read from memory array 104 will not be the same as the test data written to memory array 104. In such a scenario, compare logic 144 generates an error signal 146 when the test data written to memory array 104 is not the same as the actual data read from memory array 104. The error signal 146 is then output to an error signal built-in self stress contact 28 (FIG. 3).

While the invention in its various disclosed embodiments may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. A semiconductor die configured for wafer-level burn-in, comprising:
   an integrated circuit including at least one interface;
   built-in self stress circuitry configured to exercise the at least one interface of the integrated circuit during wafer-level burn-in of the semiconductor die; and
   a plurality of contacts coupled to the built-in self stress circuitry and configured to individually operably enable and allow monitoring of the built-in self stress circuitry by burn-in test equipment during the wafer-level burn-in.

2. The semiconductor die of claim 1, wherein each of the plurality of contacts is configured to provide power and an enable signal to the built-in self stress circuitry.

3. The semiconductor die of claim 2, wherein each of the plurality of contacts is further configured to provide a verify signal indicative of the operation status of the built-in self stress circuitry.

4. The semiconductor die of claim 2, wherein each of the plurality of contacts is further configured to provide an error signal indicative of the operation status of the integrated circuit.

5. The semiconductor die of claim 1, wherein each of the plurality of contacts is configured to provide a dedicated coupling of the built-in self stress circuitry with a wafer-level burn-in tester.

6. The semiconductor die of claim 1, wherein each of the plurality of contacts is coupled to the built-in self stress circuitry via a redistribution circuit.

7. The semiconductor die of claim 1, wherein the built-in self stress circuitry includes initialization logic configured to provide an initialization sequence to the integrated circuit through the at least one interface of the integrated circuit.

8. The semiconductor die of claim 1, wherein the built-in self stress circuitry includes an oscillator configured to generate a clock signal to the integrated circuit.

9. The semiconductor die of claim 1, wherein the integrated circuit is a memory circuit.

10. The semiconductor die of claim 9, wherein the built-in self stress circuitry includes an address generator configured to sequence an address space of the memory circuit via the at least one interface.

11. The semiconductor die of claim 9, wherein the built-in self stress circuitry includes a data generator configured to provide data patterns to the memory circuit via the at least one interface.

12. A semiconductor wafer, comprising:
a plurality of semiconductor dice substantially electrically isolated from each other; and
the plurality of semiconductor dice each including:
an integrated circuit including at least one interface;
built-in self stress circuitry configured to exercise the at least one interface of the integrated circuit during wafer-level burn-in of the semiconductor wafer; and
a plurality of contacts coupled to the built-in self stress circuitry and configured to individually operably enable and allow monitoring of the built-in self stress circuitry by burn-in test equipment during the wafer-level burn-in.

13. The semiconductor wafer of claim 12, wherein each of the plurality of semiconductor dice is configured for independent operation during the wafer-level burn-in of the semiconductor wafer.

14. The semiconductor wafer of claim 12, wherein each of the plurality of contacts is coupled to the built-in self stress circuitry via a redistribution circuit.

15. The semiconductor wafer of claim 14, wherein the redistribution circuit is configured to spatially rearrange the plurality of contacts for probing by a probe card during the wafer-level burn-in.

16. The semiconductor wafer of claim 12, wherein each of the plurality of contacts is configured to provide power and an enable signal to the built-in self stress circuitry.

17. The semiconductor wafer of claim 12, wherein each of the plurality of contacts is further configured to provide a verify signal indicative of the operation status of the built-in self stress circuitry.

18. The semiconductor wafer of claim 12, wherein each of the plurality of contacts is further configured to provide an error signal indicative of the operation status of the integrated circuit.

19. A method for testing a plurality of semiconductor dice, comprising:
forming a plurality of semiconductor dice on a semiconductor wafer, each of the plurality of semiconductor dice including an integrated circuit and built-in self stress circuitry configured to exercise at least one interface of the integrated circuit during wafer-level burn-in of the semiconductor wafer; and
forming a plurality of contacts on each of the plurality of semiconductor dice, each of the plurality of contacts coupled to the built-in self stress circuitry and configured to individually operably enable and allow monitoring of the built-in self stress circuitry by burn-in test equipment during wafer-level burn-in.

20. The method of claim 19, further comprising electrically coupling a probe card to the semiconductor wafer, the probe card including a plurality of pins for electrically coupling with each of the plurality of contacts on the plurality of semiconductor dice.

21. The method of claim 20, further comprising individually controlling each of the plurality of semiconductor dice through the plurality of contacts on each of the plurality of semiconductor dice.

22. The method of claim 21, wherein the individually controlling each of the plurality of semiconductor dice includes providing power and an enable signal to the built-in self stress circuitry.

23. The method of claim 22, wherein the integrated circuit is configured as a memory circuit and the individually controlling further includes accessing of an address space of the memory circuit.

24. The method of claim 23, further comprising generating data patterns to the memory circuit during the accessing of the address space of the memory circuit.

25. The method of claim 19, further comprising generating a clock signal in the built-in self stress circuitry for clocking the integrated circuit.

26. The method of claim 19, further comprising the built-in self stress circuitry initializing the integrated circuit.

27. The method of claim 19, further comprising monitoring each of the plurality of semiconductor dice to verify the built-in self stress circuitry is operating on each of the plurality of semiconductor dice.

28. The method of claim 19, further comprising monitoring each of the plurality of semiconductor dice for an error signal indicative of the operation status of the integrated circuit.

29. The method of claim 19, wherein forming a plurality of contacts further includes forming a redistribution circuit between the built-in self stress circuitry and the plurality of contacts on each of the plurality of semiconductor dice.

* * * * *